United States Patent
Ma et al.

(10) Patent No.: US 6,709,898 B1
(45) Date of Patent: Mar. 23, 2004

(54) DIE-IN-HEAT SPREADER MICROELECTRONIC PACKAGE

(75) Inventors: Qing Ma, San Jose, CA (US); Harry H. Fujimoto, Sunnyvale, CA (US); Steven Towle, Sunnyvale, CA (US); John E. Evert, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 71 days.

(21) Appl. No.: 09/679,733

(22) Filed: Oct. 4, 2000

(51) Int. Cl.[7] .................. H01L 21/44; H01L 23/495
(52) U.S. Cl. ........................... 438/122; 257/675
(58) Field of Search ........................ 438/106, 118, 438/119, 121, 122, 124, 126, 612, 613; 257/712, 713, 719, 738, 796, 675

(56) References Cited

U.S. PATENT DOCUMENTS

| | | | |
|---|---|---|---|
| 4,400,870 A | * | 8/1983 | Islam .......................... 29/832 |
| 5,353,498 A | | 10/1994 | Fillion et al. |
| 5,409,865 A | * | 4/1995 | Karnezos ..................... 29/827 |
| 5,422,513 A | | 6/1995 | Marcinkiewicz et al. |
| 5,497,033 A | | 3/1996 | Fillion et al. |
| 5,527,741 A | | 6/1996 | Cole et al. |
| 5,703,400 A | | 12/1997 | Wojnarowski et al. |
| 5,745,984 A | | 5/1998 | Cole, Jr. et al. |
| 6,271,469 B1 | * | 8/2001 | Ma et al. ..................... 174/52.4 |
| 6,274,391 B1 | * | 8/2001 | Wachtler et al. ............... 438/6 |
| 6,380,615 B1 | * | 4/2002 | Park et al. ................... 257/686 |
| 6,396,136 B2 | * | 5/2002 | Kalidas et al. ............... 257/691 |
| 6,423,570 B1 | | 7/2002 | Ma et al. ..................... 438/106 |

FOREIGN PATENT DOCUMENTS

| | | |
|---|---|---|
| JP | 11045955 | 2/1999 |
| JP | 11312868 | 11/1999 |

OTHER PUBLICATIONS

IBM Technical Disclosure Bulletin, p. 4469–4470, Mar. 1980.*

IBM Technical Disclosure Bulletin, p. 4469–4470, Mar. 1980.*

* cited by examiner

Primary Examiner—W. David Coleman
Assistant Examiner—Brook Kebede
(74) Attorney, Agent, or Firm—Schwegman, Lundberg, Woessner & Kluth, P.A.

(57) ABSTRACT

Microelectronic packages including a microelectronic die disposed within a recess in a heat spreader and build-up layers of dielectric materials and conductive traces are then fabricated on the microelectronic die and the heat spreader to form the microelectronic package, and methods for the fabrication of the same, including methods to align the microelectronic die within the heat spreader. In another embodiment, a microelectronic die is disposed on a heat spreader which has a filler material disposed therearound and build-up layers of dielectric materials and conductive traces are then fabricated on the microelectronic die and the filler material to form the microelectronic package, and methods for the fabrication of the same, including methods to align the microelectronic die on the heat spreader.

17 Claims, 10 Drawing Sheets

DIE-IN-HEAT SPREADER MICROELECTRONIC PACKAGE

BACKGROUND OF THE INVENTION

1. Field of the Invention

The present invention relates to apparatus and processes for packaging microelectronic dice. In particular, the present invention relates to a packaging technology that encapsulates a microelectronic die within a heat spreader.

2. State of the Art

Higher performance, lower cost, increased miniaturization of integrated circuit components, and greater packaging density of integrated circuits are ongoing goals of the computer industry. As these goals are achieved, microelectronic dice become smaller. Of course, the goal of greater packaging density requires that the entire microelectronic die package be equal to or only slightly larger (about 10% to 30%) than the size of the microelectronic die itself. Such microelectronic die packaging is called a "chip scale packaging" or "CSP".

As shown in FIG. 27, true CSP would involve fabricating build-up layers directly on an active surface 204 of a microelectronic die 202. The build-up layers may include a dielectric layer 206 disposed on the active surface 204 and conductive traces 208 may be formed on the dielectric layer 206, wherein a portion of each conductive trace 208 contacts at least one contact 212 on the active surface 204. External contacts, such as solder balls or pins for contacting an external devices (not shown), may be fabricated to contact at least one conductive trace 208. FIG. 27 illustrates the external contacts as solder balls 214 which are surrounded by a solder mask material 216 on the dielectric layer 206. However, the surface area provided by the active surface 204 generally does not provide enough surface for all of the external contacts needed to contact the external device (not shown) for certain types of microelectronic dice (e.g., logic).

Additional surface area can be provided with the use of an interposer, such as a substantially rigid material or a substantially flexible material. FIG. 28 illustrates a substrate interposer 222 having a microelectronic die 224 attached to and in electrical contact with a first surface 226 of the substrate interposer 222 through solder balls 228. The solder balls 228 extend between contacts 232 on the microelectronic die 224 and conductive traces 234 on the substrate interposer first surface 226. The conductive traces 234 are in discrete electrical contact with bond pads 236 on a second surface 238 of the substrate interposer 222 through vias 242 that extend through the substrate interposer 222. External contacts 244 are formed on bond pads 236. The external contacts 244 are utilized to achieve electrical communication between the microelectronic die 224 and an external electrical system (not shown).

The use of the substrate interposer 222 requires number of processing steps which increase the cost of the package. Additionally, the use of the small solder balls 228 presents crowding problems which can result in shorting between the small solder balls 228 and can present difficulties in inserting underfill material between the microelectronic die 224 and the substrate interposer 222 to prevent contamination and provide mechanical stability. Furthermore, the necessity of having two sets of solder balls (i.e., small solder balls 228 and external contacts 244) to achieve connection between the microelectronic die 224 and the external electrical system decreases the overall performance of the package.

Another problem arising from the fabrication of a smaller microelectronic die is that the density of power consumption of the integrated circuit components in the microelectronic die has increased, which, in turn, increases the average junction temperature of the die. If the temperature of the microelectronic die becomes too high, the integrated circuits of the semiconductor die may be damaged or destroyed. Furthermore, for microelectronic dice of equivalent size, the overall power increases which presents the same problem of increased power density.

Various apparatus and techniques have been used for removing heat from microelectronic dice. One such heat dissipation technique involves the attachment of a heat sink to a microelectronic die. FIG. 29 illustrates an assembly 250 comprising a microelectronic die 252 physically and electrically attached to a substrate carrier 254 by a plurality of solder balls 256. A heat sink 258 is attached to a back surface 262 of the microelectronic die 252 by a thermally conductive adhesive 264. The heat sink 258 is usually a slug constructed from a thermally conductive material, such as copper, copper alloys, aluminum, aluminum alloys, and the like. Heat generated by the microelectronic die 252 is conductively drawn into the slug-type heat sink 258 (following the path of least thermal resistance) and convectively dissipated from the slug-type heat sink 258 into the air surrounding the heat sink assembly 250. Thus, as the size or "footprint" of microelectronic dice decreases, the contact area between the micro-electronic die 252 and the heat sink 258 decreases, which reduces the area available for conductive heat transfer. Thus, with a decrease of the size in the microelectronic die 252, heat dissipation from a slug-type heat sink 258 becomes less efficient.

Therefore, it would be advantageous to develop new apparatus and techniques to provide additional surface area to form traces for use in CSP applications, eliminate the necessity of the substrate interposer, and provide improved heat dissipation.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Although FIGS. 1–26 illustrate various views of the present invention, these figures are not meant to portray microelectronic assemblies in precise detail. Rather, these figures illustrate microelectronic assemblies in a manner to more clearly convey the concepts of the present invention. Additionally, elements common between the figures retain the same numeric designation.

The present invention includes a packaging technology that places at least one microelectronic dice within at least one recess in a heat spreader and secures the microelectronic die/dice within the recesses with an adhesive material. Build-up layers of dielectric materials and conductive traces are then fabricated on the microelectronic die, the encapsulant material, and the heat spreader to form a microelectronic package.

The technical advantage of this invention is that the present invention enables the microelectronic package to be built around the microelectronic die. This provides sufficient surface area to position external contacts, while eliminating the need for a substrate interposer, as discussed above. The elimination of the substrate interposer increases the performance of the microelectronic package by eliminating one set of solder connections. Furthermore, the elimination of the substrate interposer increases power delivery performance by bringing the circuitry within the microelectronic die closer to power delivery components (such as decoupling capacitors, etc.) of the external electrical system to which the microelectronic package is attached. Moreover, having the microelectronic die within a heat spreader allows the heat spreader to absorb heat from the sides of a microelectronic die as well as the back surface of the microelectronic die. This results in more efficient removal of heat from the microelectronic die. Yet further, the configurations of the present invention allow for direct bumpless build-up layer techniques to be used which allows the package to be scaleable. The configurations also result in a thinner form factors, as no additional heat spreader is needed for the package.

Figure 1:
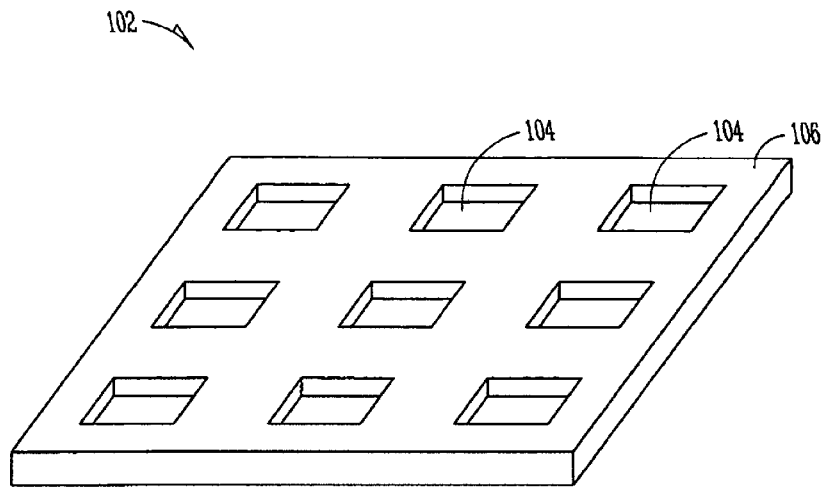
FIG. 1 is an oblique view of a heat spreader having multiple recesses, according to the present invention.
Figure 2:
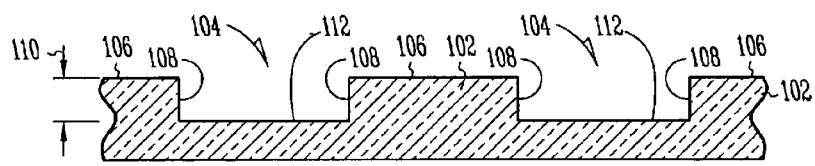
FIG. 2 is a side cross-sectional view of a heat spreader having recesses with substantially vertical sidewalls, according to the present invention.

FIG. 1 illustrates a heat spreader 102 used to fabricate a microelectronic package. The heat spreader 102 preferably comprises a substantially planar, highly thermally conductive material. The material used to fabricate the heat spreader 102 may include, but is not limited to, metals, such as copper, copper alloys, molybdenum, molybdenum alloys, aluminum, aluminum alloys, and the like. The material used to fabricate the heat spreader may also include, but is not limited to, thermally conductive ceramic materials, such as AlSiC, AlN, and the like. It is further understood that the heat spreader 102 could be a more complex device such as a heat pipe. The heat spreader 102 has at least one recess 104 extending into the heat spreader 102 from a first surface 106 thereof. FIG. 2 illustrates a side cross-sectional view of the heat spreader 102. Each recess 104 is defined by at least one sidewall 108 and a substantially planar bottom surface 112.

Figure 3:
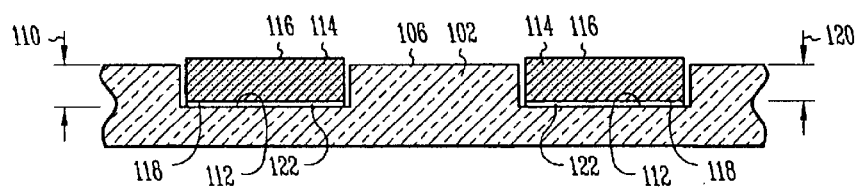
FIG. 3 is a side cross-sectional view of the heat spreader of FIG. 2 having a plurality of microelectronic dice residing within corresponding recesses, according to the present invention.

FIG. 3 illustrates microelectronic dice 114, each having an active surface 116 and a back surface 118, placed in corresponding heat spreader recesses 104 (see FIG. 2), wherein the recesses 104 are appropriately sized and shaped to receive the microelectronic dice 114. Preferably, the size of each heat spreader recess 104 is slightly larger than the size of its corresponding microelectronic die 114 for easy placement and alignment. Fiducial marks (not shown) on both microelectronic die 114 and heat spreader 102 may be used for alignment.

A depth 110 (see FIG. 2) of the heat spreader recesses 104 is preferably approximately the same dimension as a thickness 120 of the microelectronic die 114 (shown slightly thicker than the depth 110 of the heat spreader recesses 104 in FIG. 3). The spacing between the heat spreader recesses 104 is, of course, determined by the targeted microelectronic die package size.

The microelectronic dice 114 are attached to the bottom surface 112 of each of the recesses 104 with a thermally conductive adhesive material 122. The adhesive material 122 may comprise a resin or epoxy material filled with thermally conductive particulate material, such as silver or aluminum nitride. The adhesive material 122 may also comprise metal and metal alloys having low melting temperature (e.g., solder materials), and the like. Although the following description relates to a bumpless, built-up layer technique for the formation of build-up layers, the method of fabrication is not so limited. The build-up layers may be fabricated by a variety of techniques known in the art.

Figure 4:
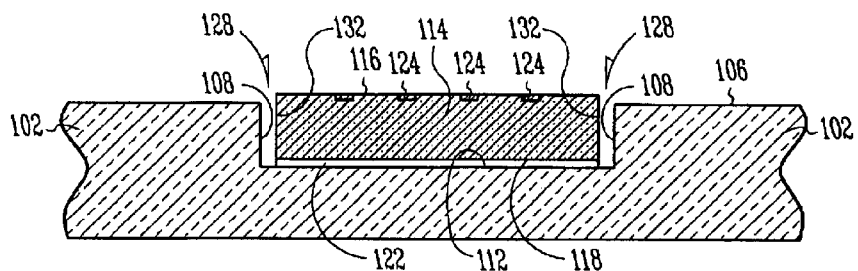
FIGS. 4–12 is a side cross-sectional views of a method of forming build-up layers on the microelectronic die and heat spreader, according to the present invention.

FIG. 4 illustrates a view of a single microelectronic die 114 attached with the adhesive material 122 within the heat spreader 102. The microelectronic die 114, of course, includes a plurality of electrical contacts 124 located on the microelectronic die active surface 116. The electrical contacts 124 are electrically connected to circuitry (not shown) within the microelectronic die 114. Only four electrical contacts 124 are shown for sake of simplicity and clarity.

Figure 5:
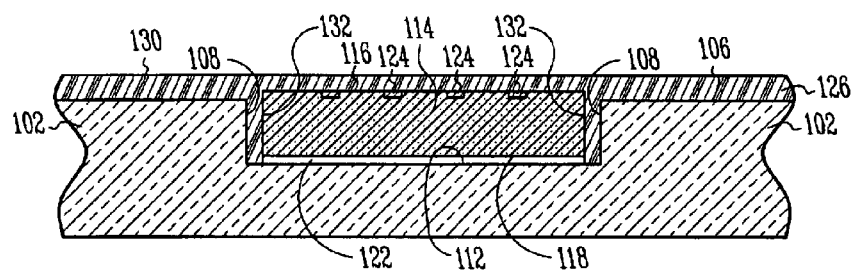

As shown in FIG. 5, a first dielectric layer 126, such as epoxy resin, polyimide, bisbenzocyclobutene, and the like, is disposed over the microelectronic die active surface 116 (including the electrical contacts 124) and the heat spreader first surface 106. The dielectric layers of the present invention are preferably filled epoxy resins available from Ibiden U.S.A. Corp., Santa Clara, Calif., U.S.A. and Ajinomoto U.S.A., Inc., Paramus, N.J., U.S.A. Preferably, the first dielectric layer 126 flows into gaps 128 (see FIG. 4) between the recess sidewall 108 and sides 132 of microelectronic dice 114. The formation of the first dielectric layer 126 may be achieved by any known process, including but not limited to lamination, roll-coating and spray-on deposition. Preferably, an exposed surface 130 of the first dielectric layer 126 is substantially planar. If the first dielectric layer exposed surface 130 is not sufficiently planar, any known planarization technique, such as chemical mechanical polishing, etching, and the like, may be employed.

Figure 6:
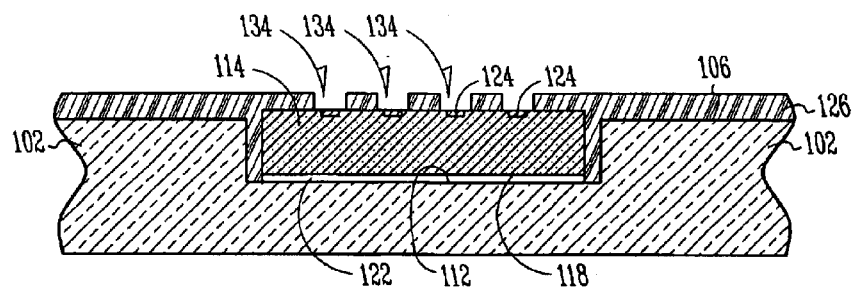

As shown in FIG. 6, a plurality of vias 134 are then formed through the first dielectric layer 126. The plurality of vias 134 may be formed any method known in the art, including but not limited to laser drilling, photolithography, and, if the first dielectric layer 126 is photoactive, forming the plurality of vias 134 in the same manner that a photoresist mask is made in a photolithographic process, as known in the art.

Figure 7:
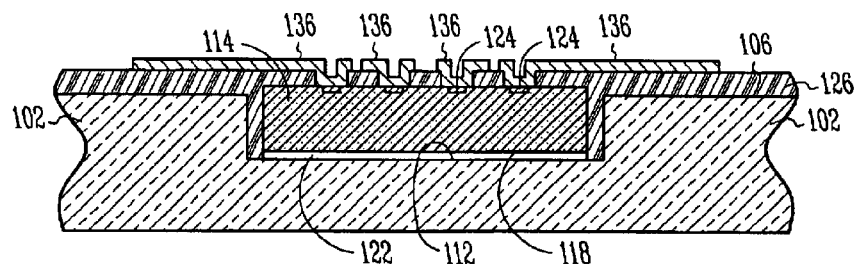

A plurality of conductive traces 136 is formed on the first dielectric layer 126, as shown in FIG. 7, wherein a portion of each of the plurality of conductive traces 136 extends into at least one of said plurality of vias 134 (see FIG. 6) to make electrical contact with the electrical contacts 124. The plurality of conductive traces 136 may be made of any applicable conductive material, such as copper, aluminum, and alloys thereof.

The plurality of conductive traces 136 may be formed by any known, technique, including but not limited to semi-additive plating and photolithographic techniques. An exemplary semi-additive plating technique can involve depositing a seed layer, such as sputter-deposited or electroless-deposited-metal on the first dielectric layer 126. A resist layer is then patterned on the seed layer, such as a titanium/copper alloy, followed by electrolytic plating of a layer of metal, such as copper, on the seed layer exposed by open areas in the patterned resist layer. The patterned resist layer is stripped and portions of the seed layer not having the layer of metal plated thereon is etched away. Other methods of forming the plurality of conductive traces 136 will be apparent to those skilled in the art.

Figure 8:
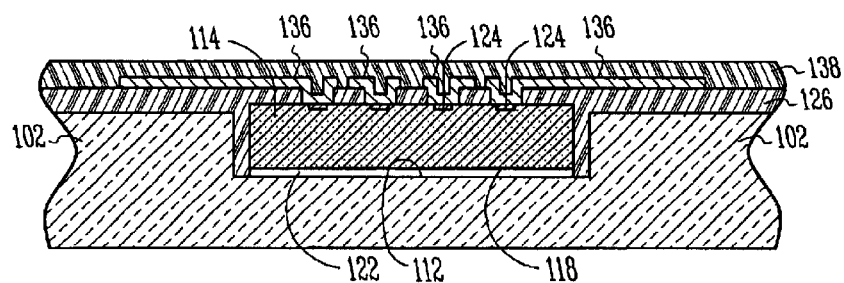

As shown in FIG. 8, a second dielectric layer 138 is disposed over the plurality of conductive traces 136 and the first dielectric layer 126. The formation of second dielectric layer 138 may be achieved by any known process, including but not limited to roll-coating and spray-on deposition.

Figure 9:
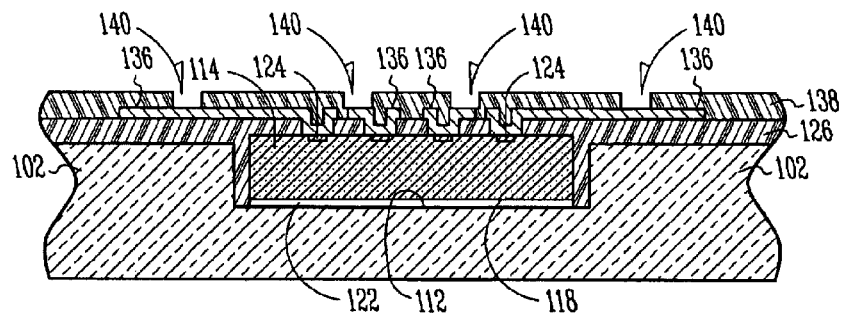

As shown in FIG. 9, a plurality of second vias 140 are then formed through the second dielectric layer 138. The plurality of second vias 140 may be formed any method known in the art, including but not limited to laser drilling and, if the second dielectric layer 138 is photoactive, forming the plurality of second vias 140 in the same manner that a photoresist mask is made in a photolithographic process, as known in the art.

If the plurality of conductive traces 136 is not capable of placing the plurality of second vias 140 in an appropriate position, then other portions of the conductive traces are formed in the plurality of second vias 140 and on the second dielectric layer 138, another dielectric layer formed thereon, and another plurality of vias is formed in the ;L. dielectric layer, such as described in FIGS. 7–9. The layering of dielectric layers and the formation of conductive traces can be repeated until the vias are in an appropriate position. Thus, portions of a single conductive trace be formed from multiple portions thereof and can reside on different dielectric layers. Additional dielectric layers and conductive layers may be included in order to provide power and ground planes which ensure adequate power distribution and control impedance.

Figure 10:
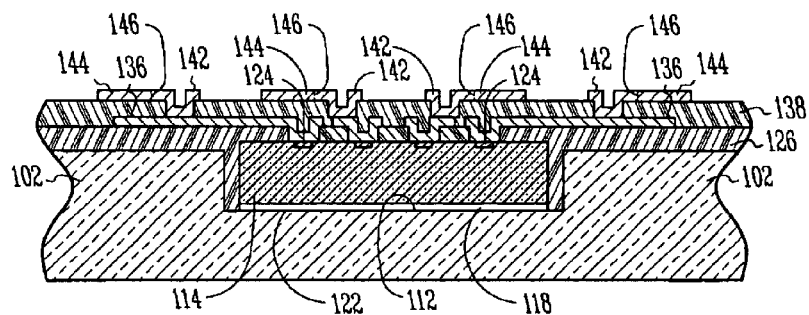

A second plurality of conductive traces 142 may be formed, wherein a portion of each of the second plurality of conductive traces 142 extends into at least one of said plurality of second vias 140 (see FIG. 9). The second plurality of conductive traces 142 each include a landing pad 144 (an enlarged area on the traces demarcated by a dashed line 146), as shown in FIG. 10.

Figure 11:
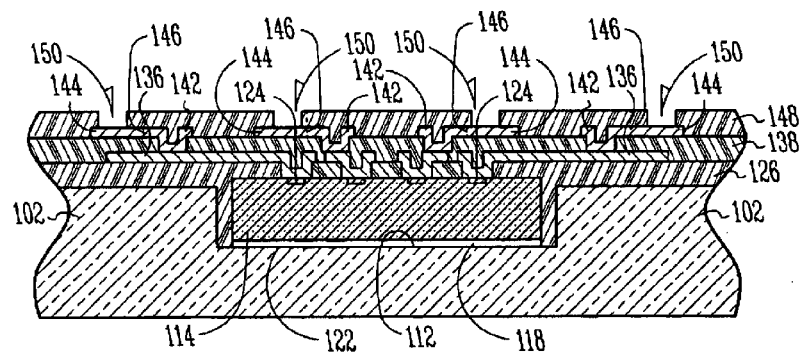
Figure 12:
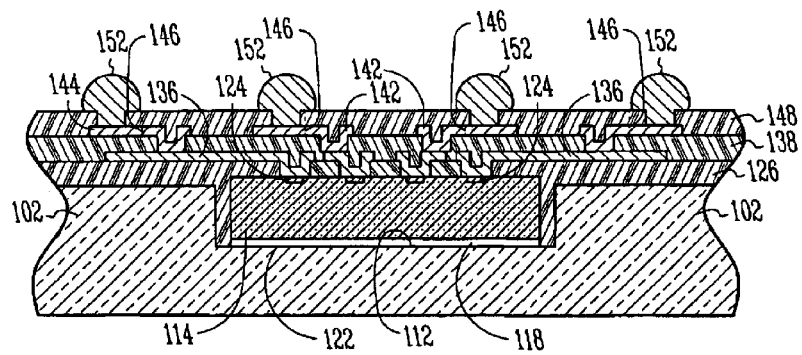

Once the second plurality of conductive traces 142 and landing pads 144 are formed, they can be used in the formation of conductive interconnects, such as solder bumps, solder balls, pins, and the like, for communication with external components (not shown). For example, a solder mask material 148 can be disposed over the second dielectric layer 138 and the second plurality of conductive traces 142 and landing pads 144. A plurality of vias 150 is then formed in the solder mask material 148 to expose at least a portion of each of the landing pads 134, as shown in FIG. 11. A plurality of conductive bumps 152, such as solder bumps, can be formed, such as by screen printing solder paste followed by a reflow process or by known plating techniques, on the exposed portion of each of the landing pads 144, as shown in FIG. 12.

Figure 13:
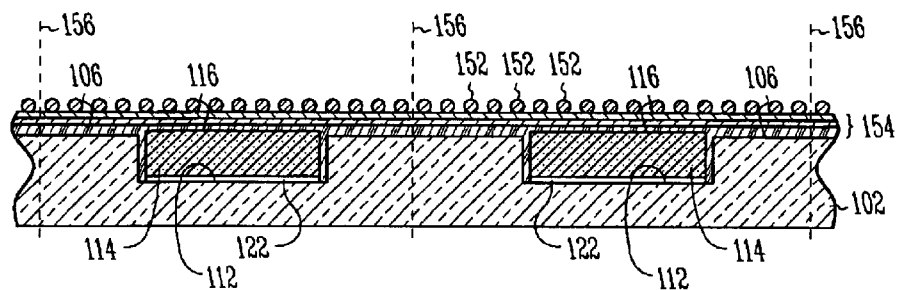
FIG. 13 is a side cross-sectional view of the assembly of FIG. 3 having build-up layers and solder balls positioned thereon, according to the present invention.
Figure 14:
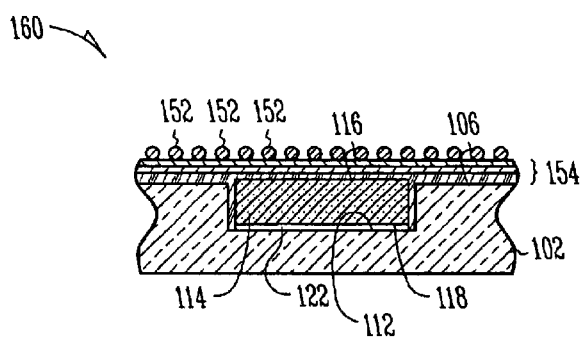
FIG. 14 is a side cross-sectional view of a singulated device, according to the present invention.

FIG. 13 illustrates a plurality of microelectronic dice 114 residing within the heat spreader 102. At least one build-up layer is formed on the microelectronic dice active surfaces 116 and the heat spreader first surface 106. The layer(s) of dielectric material and conductive traces comprising the build-up layer is simply designated together as build-up layer 154 in FIG. 13. The individual microelectronic dice 114 are then singulated (cut) along lines 156 through the build-up layer 154 and the heat spreader 102 to form at least one singulated microelectronic die package 160, as shown in FIG. 14.

Figure 15:
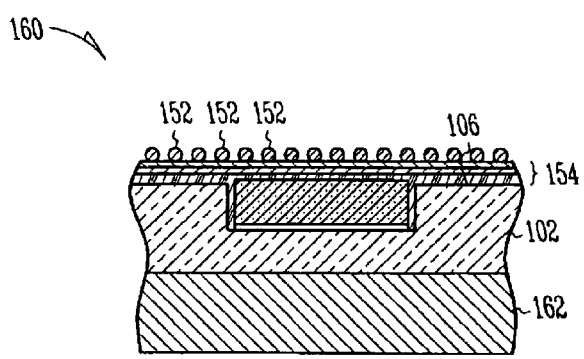
FIG. 15 is a side cross-sectional view of the singulated device having a heat dissipation device attached to the heat spreader, according to the present invention.

Preferably, the heat spreader 102 adequately removes the heat from the microelectronic die 114. However, if the heat spreader 102 does not do so, a conductive heat sink 162 may be attached to the heat spreader 102, as shown in FIG. 15. The material used to fabricate the heat sink 162 may include, but is not limited to, metals (copper, molybdenum, aluminum, alloy thereof, and the like), ceramics (AlSiC, AlN, and the like), or a heat pipe.

Figure 16:
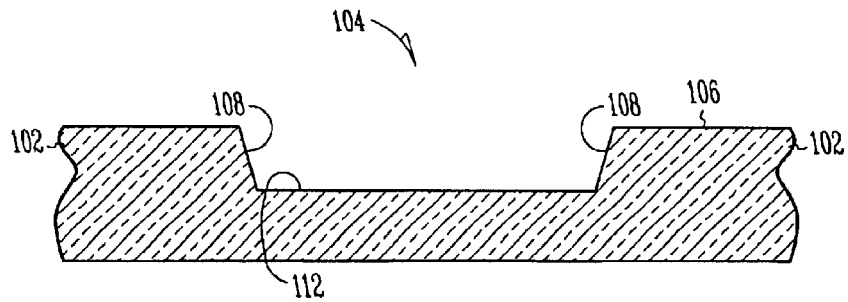
FIG. 16 is a side cross-sectional view of a heat spreader having recesses with substantially sloped sidewalls, according to the present invention.

Although FIGS. 1–15 illustrate the heat spreader recesses 104 having substantially vertical recess sidewalls 108, it is understood that the recess sidewalls 108 may be sloped to assist in the alignment of the microelectronic die 114 in the heat spreader recesses 104. FIG. 16 illustrates a heat spreader 102 having sloped recess sidewalls 108.

Figure 17:
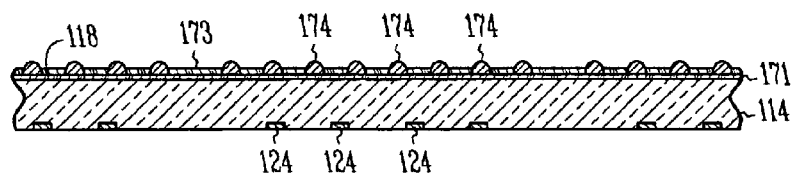
FIG. 17 is a semiconductor wafer having a plurality of solder bumps on a bottom surface thereof, according to the present invention.

FIGS. 17–21 illustrate a self-aligning solder embodiment of the present invention to simply and accurately place the microelectronic dice in the heat spreader recess 104 while providing thermal conduction between the microelectronic die 114 and the heat spreader 102. As shown in FIG. 17, the first plurality of solder bumps 174, preferably highly thermally conductive material such as a lead, tin, indium, gallium, bismuth, cadmium, zinc, copper, gold, silver, antimony, germanium, and alloys thereof, most preferably indium-based and tin-based solder, is formed across an entire wafer 170 before the microelectronic die 114 is diced therefrom. This ensures that the first plurality of solder bumps 174 are positioned the same on all microelectronic dice 114 and to reduce cost. The first plurality of solder bumps 174 may be aligned with a feature, as a fiducial marker (not shown), on the front side of the wafer.

The solder bumps 174 may be formed by first applying a wetting layer 171, such as a seed layer as known in the art, to the back surface of the wafer corresponding to the microelectronic die back surface 118. A removable solder dam 173, such as a photoresist, is patterned over the wetting layer 171 to prevent the solder of the solder bumps 174 prematurely wetting across the wetting layer 171. The solder bumps 174 may be formed by a plating technique or by screen printing a paste into opening in the photoresist and reflowing the paste to form solder bumps.

Figure 18:
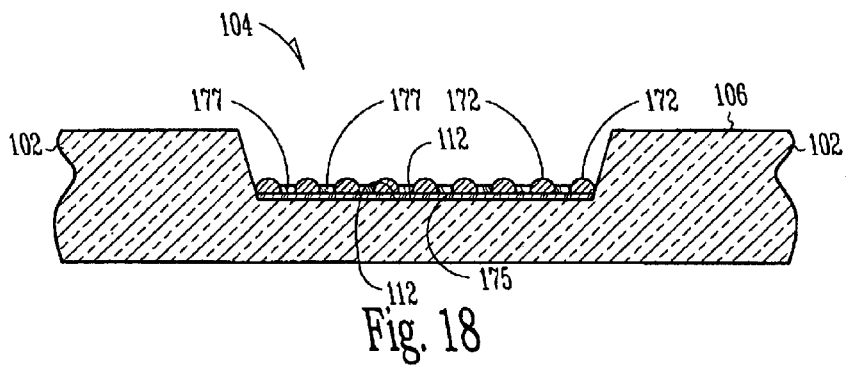
FIG. 18 is a side cross-sectional view of the heat spreader of FIG. 16 having a plurality of solder bumps on a bottom surface thereof, according to the present invention.
Figure 19:
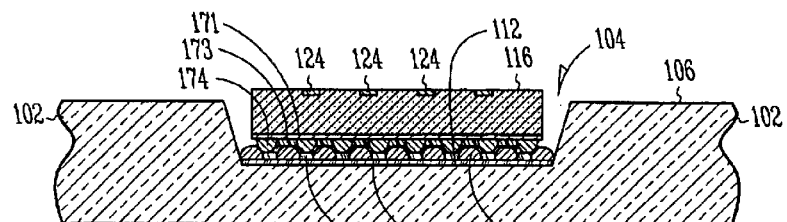
FIG. 19 is a side cross-sectional view of a diced microelectronic die from the semiconductor wafer of FIG. 17 placed in the recess of the heat spreader of FIG. 16, according to the present invention.

As shown in FIG. 18, a second plurality of solder bumps 172 may be disposed on the bottom surface 112 of the heat spreader recess 104, with a wetting layer 175 and a removable solder dam 177, using the technique described above. The second plurality of solder bumps 172 may be made from materials such as described for the first plurality of solder bumps 174. The second plurality of solder bumps 172 may be aligned with a feature, such as a fiducial marker (not shown) on the heat spreader 102. As shown in FIG. 19, the microelectronic die 114 (after dicing) is placed within the heat spreader recess 104 wherein the first plurality of solder bumps 174 and the second plurality of solder bumps 172 align the microelectronic die 114 into a desired position. The first plurality of solder balls 174 and the second plurality of solder balls 172 may be of differing sizes and composition for initial alignment and final thermal contact. It is, of course, understood that one could apply solder bumps to either the microelectronic die 114 or the heat speader recess 104 alone.

Figure 20:
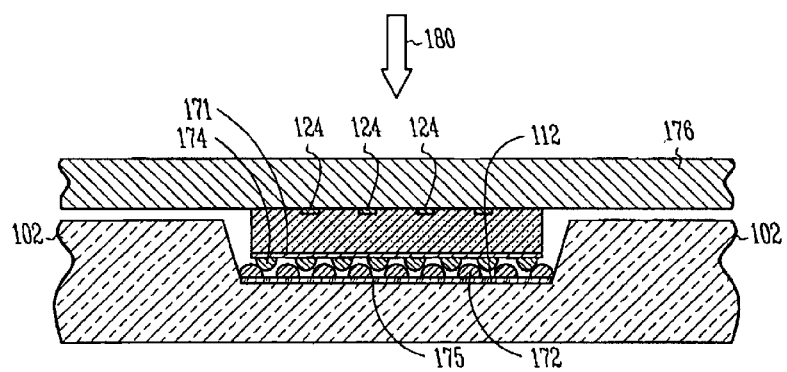
FIG. 20 is a side cross-sectional view of the assembly of FIG. 19 having a platen abutting an active surface of the microelectronic die, according to the present invention.
Figure 21:
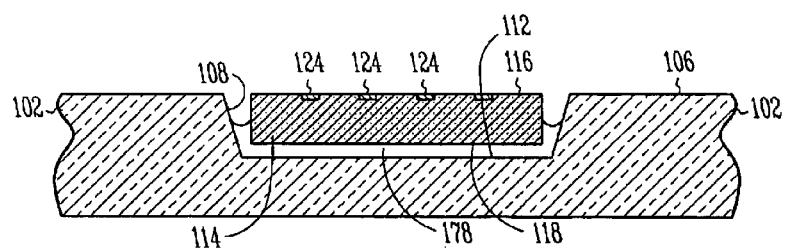
FIG. 21 is a side cross-sectional view of the heat spreader having the microelectronic die attached to the bottom surface of the heat spreader with solder, according to the present invention.

The heat spreader 102 is heated to or above the melting point of the first plurality of solder bumps 174 and the second plurality of solder bumps 172 to reflow the same, wherein capillary action between the bumps aligns the microelectronic die 114. The microelectronic die removable solder dam 173 and the heat spreader removable solder dam 177 are then removed, such as by a photoresist strip process as known in the art. Next, as shown in FIG. 20, a platen 176 is placed against the microelectronic die active surface 116 to hold the microelectronic die 114 in place horizontally while compressing vertically and heating under a vacuum or partial vacuum to again reflow the solder of the first plurality of solder balls 172 and the second plurality of solder balls 174. In this process, any relative horizontal movement should be avoided by pressing vertically in direction 180. The pressure is not released until after the solder has cooled below its melting temperature. This results in a substantially continuous thermal contact solder layer 178 between the microelectronic die back surface 118 and the recess bottom surface 112, as shown in FIG. 21. The vacuum or partial vacuum help prevent or eliminate the presence of air bubbles within the substantially continuous thermal contact solder layer 178. The use of the platen 176 (see FIG. 20) also results in the heat spreader top surface 106 and the microelectronic die active surface 116 being substantially coplanar, as also shown in FIG. 21.

Figure 22:
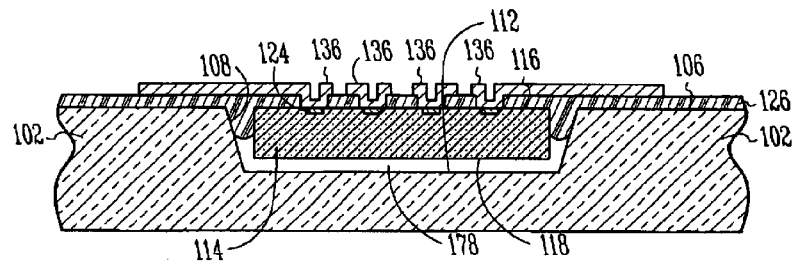
FIG. 22 is a side cross-sectional view of build-up layers on the heat spreader and microelectronic die of FIG. 18, according to the present invention.

As previously discussed, build-up layers (illustrated as a dielectric layer 126 and conductive traces 136) may then formed on the microelectronic die active surface 116 and the heat spreader first surface 106, as shown in FIG. 22.

Figure 23:
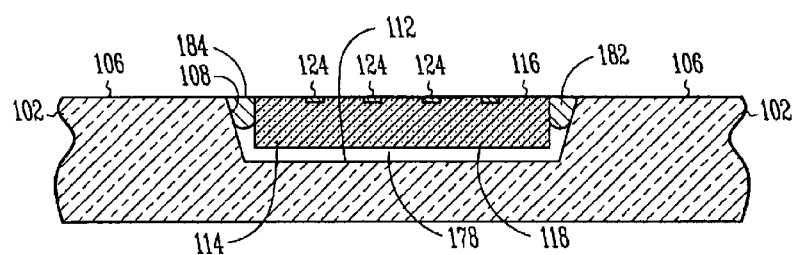
FIG. 23 is a side cross-sectional view of the heat spreader and microelectronic die of FIG. 21 having a filler material between the recess sidewall and the microelectronic die, according to the present invention.
Figure 24:
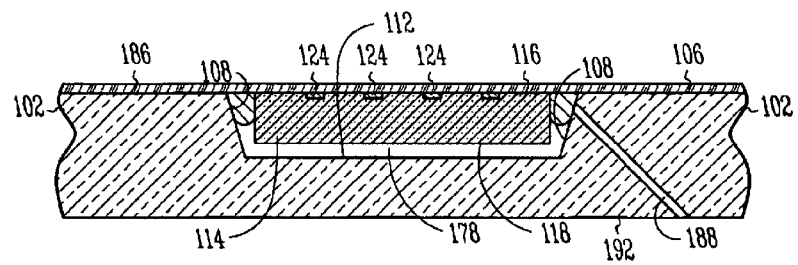
FIG. 24 is a side cross-sectional view of the microelectronic die and heat spreader having a channel therein to inject the filler material between the recess sidewall and the microelectronic die, according to the present invention.

In an alternate embodiment, a filler material 182, such as plastics, resins, epoxies, and the like, may be disposed into any remaining gap between the microelectronic die 114 and the recess sidewalls 108 to form a planar surface 184 between the microelectronic die active surface 116 and the heat spreader first surface 106, as shown in FIG. 23. This may be achieved by placing a tape film 186 over the microelectronic die active surface 116 and the heat spreader first surface 106, as shown in FIG. 24. The tape film 104 is preferably a substantially flexible material, such as Kapton® polyimide film (E. I. du Pont de Nemours and Company, Wilmington, Del.), but may be made of any appropriate material, including metallic films, having an adhesive, such as silicone, disposed thereon. The filler material 182 (not shown) is injected through at least one channel 188 extending from a heat spreader second surface 192 to the recess sidewall 108.

Figure 25:
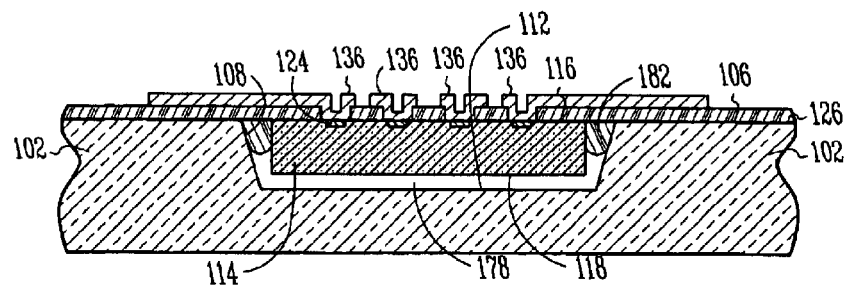
FIG. 25 is a side cross-sectional view of build-up layers on the heater spreader, filler material, and microelectronic die of FIG. 23, according to the present invention.

As previously discussed, build-up layers (illustrated as a dielectric layer 126 and conductive traces 136) may then formed on the microelectronic die active surface 116, the filler material planar surface 184, and the heat spreader first surface 106, as shown in FIG. 25.

Figure 26:
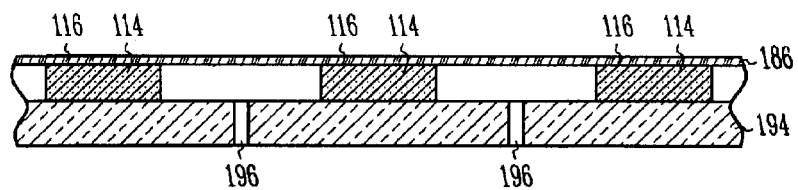
FIG. 26 is a side cross-sectional view of an alternate embodiment of a heat spreader which can be utilized in the present invention.
Figure 27:
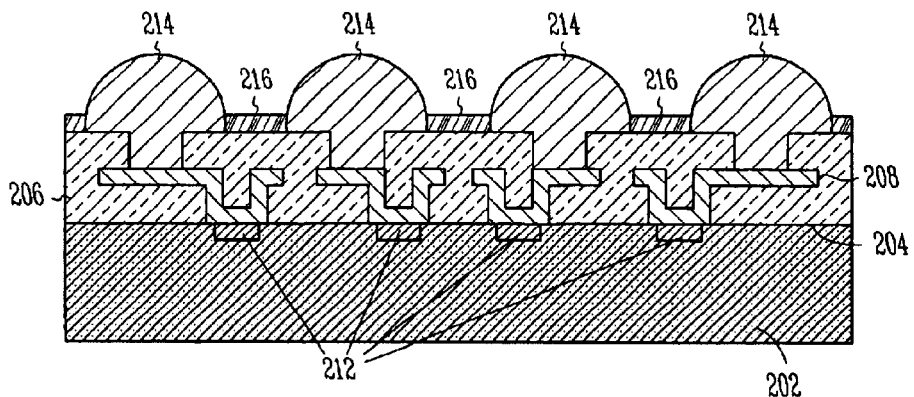
FIG. 27 is a side cross-sectional view of a true CSP of a microelectronic device, as known in the art.
Figure 28:
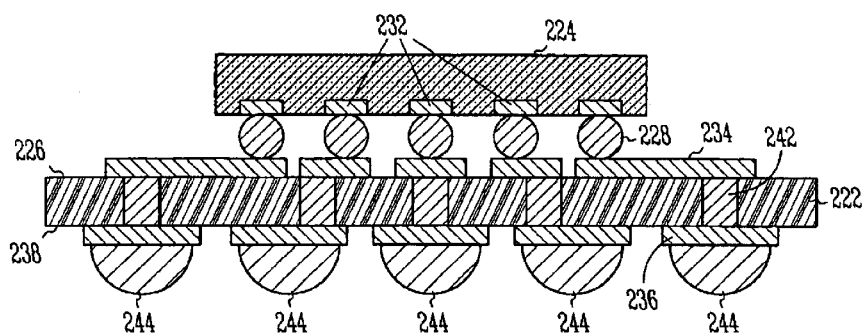
FIG. 28 is a side cross-sectional view of a CSP of a microelectronic device utilizing a substrate interposer, as known in the art.
Figure 29:
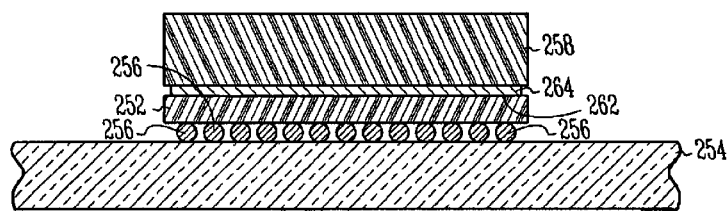
FIG. 29 is a side cross-sectional view of a slug-type heat dissipation device attached to a semiconductor die, as known in the art.

In another embodiment of the present invention as shown in FIG. 26, a planar heat spreader 194 may be utilized, wherein the microelectronic dice 114 are attached to the planar heat spreader 194. The attachment may be achieved by an adhesive or the self-aligning solder embodiment discussed above. A tape film 186 is attached to the microelectronic die active surfaces 116 and a filler material 182 (not shown) is injected through at least one channel 196 extending through the planar heat spreader 194. After which build-up layers may be formed on the microelectronic die active surfaces 116 and the filler material 182 (not shown), as previously discussed.

It is, of course, understood that individual packages may be formed by cutting through the heat spreader and portions of the build-up layers, as previously discussed and illustrated.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating a microelectronic package, comprising:

provided a heat spreader having a first surface, said heat spreader having at least one recess defined therein by at least one sidewall extending from said heat spreader first surface to a recess bottom surface;

disposing at least one microelectronic die within said at least one recess, said at least one microelectronic die having an active surface, a back surface, and at least one side;

adhering said at least one microelectronic die back surface to said recess bottom surface;

forming at least one dielectric material layer on at least a portion of said microelectronic die active surface and said heat spreader first surface;

forming at least one via through said at least one dielectric material layer to expose a portion of said microelectronic die active surface; and forming at least one conductive trace on said at least one dielectric material layer which extends into said at least one via to electrically contact said microelectronic die active surface.

2. The method of claim 1, wherein forming at least one dielectric material layer on at least a portion of said microelectronic die active surface and said heat spreader first surface comprises flowing said at least one dielectric layer into gaps between said at least one recess sidewall and said at least one microelectronic dice side.

3. A method of fabricating a microelectronic package, comprising:

providing a heat spreader having a first surface, said heat spreader having at least one recess defined therein by at least one sidewall extending from said heat spreader first surface to a recess bottom surface;

disposing at least one microelectronic die within said at least one recess, said at least one microelectronic die having an active surface, a back surface, and at least one side; and adhering said at least one microelectronic die back surface to said recess bottom surface; wherein adhering said at least one microelectronic die back surface to said recess bottom surface further includes:

disposing a plurality of first solder bumps on said at least one microelectronic die back surface;

disposing a plurality of second solder bumps on said recess bottom surface; and forming a substantially continuous solder layer between said at least one microelectronic die back surface to said recess bottom surface by reflowing said plurality of first solder bumps and said second plurality of solder bumps.

4. The method of claim 3, wherein disposing a plurality of first solder bumps on said at least one microelectronic die back surface comprises:

patterning a solder dam material on said at least one microelectronic die back surface; and forming said plurality of solder bumps extending through said solder dam material.

5. The method of claim 3, wherein disposing a plurality of second solder bumps on said recess bottom surface comprises:

patterning a solder dam material on said recess bottom surface; and forming said plurality of solder bumps extending through said solder dam material.

6. The method of claim 3, wherein:

disposing a plurality of first solder bumps on said at least one microelectronic die back surface comprises patterning a solder dam material on said at least one microelectronic die back surface, and forming said plurality of solder bumps extending through said solder dam material;

disposing a plurality of second solder bumps on said recess bottom surface comprises patterning a solder dam material on said recess bottom surface, and forming said plurality of solder bumps extending through said solder dam material; and forming a substantially continuous solder layer between said at least one microelectronic die back surface to said recess bottom surface comprises:

reflowing said plurality of first solder bumps and said second plurality of solder bumps to align said at least one microelectronic die within said recess;

removing said solder dam material on said at least one microelectronic die back surface and on said recess bottom surface; and exerting pressure on said at least one microelectronic die back surface toward said heat spreader.

7. The method of claim 6, further including inducing at least a partial vacuum during said forming said substantially continuous solder layer.

8. A method of fabricating a microelectronic package, comprising:

providing a heat spreader having a first surface, said heat spreader having a plurality of recesses defined therein by a plurality of sidewalls extending from said heat spreader first surface to recess bottom surfaces of said plurality of recesses;

disposing at least one of a plurality of microelectronic dice within each of said plurality of recesses, each of said plurality of microelectronic dice having an active surface, a back surface, and at least one side;

adhering at least one of said plurality of microelectronic die back surfaces of said plurality of microelectronic dice to at least one corresponding recess bottom surface of said plurality of recesses;

singulating said plurality of microelectronic dice by cutting through said heat spreader;

forming at least one dielectric material layer on at least a portion of said microelectronic die active surface of said plurality of microelectronic dice and said heat spreader first surface;

forming at least one via through said at least one dielectric material layer to expose a portion of said microelectronic die active surfaces of said plurality of microelectronic dice; and forming at least one conductive trace on said at least one dielectric material layer which extends into said at least one via to electrically contact at least one of said microelectronic die active surfaces of said plurality of microelectronic dice.

9. The method of claim 8, wherein forming at least one dielectric material layer on at least a portion of said microelectronic die active surface of said plurality of microelectronic dice and said heat spreader first surface comprises flowing at least one dielectric layer into gaps between said at least one of said plurality of recess sidewalls and said at least one microelectronic dice side of said plurality of microelectronic dice.

10. A method of fabricating a microelectronic package, comprising:

providing a heat spreader having a first surface, said heat spreader having a plurality of recesses defined therein by a plurality of sidewalls extending from said heat spreader first surface to recess bottom surfaces of said plurality of recesses;

disposing at least one of a plurality of microelectronic dice within each of said plurality of recesses, each of said plurality of microelectronic dice having an active surface, a back surface, and at least one side;

adhering at least one of said plurality of microelectronic die back surfaces of said plurality of microelectronic dice to at least one corresponding recess bottom surface of said plurality of recesses; and singulating said plurality of microelectronic dice by cutting through said heat spreader disposing a filler material in gaps between said at least one of said plurality of recess sidewalls and said at least one microelectronic die side of said plurality of microelectronic dice.

11. A method of fabricating a microelectronic package, comprising:
  providing a heat spreader having a first surface, said heat spreader having a plurality of recesses defined therein by a plurality of sidewalls extending from said heat spreader first surface to recess bottom surfaces of said plurality of recesses;
  disposing at least one of a plurality of microelectronic dice within each of said plurality of recesses, each of said plurality of microelectronic dice having an active surface, a back surface, and at least one side;
  adhering at least one of said plurality of microelectronic die back surfaces of said plurality of microelectronic dice to at least one corresponding recess bottom surface of said plurality of recesses; and
  singulating said plurality of microelectronic dice by cutting through said heat spreader, wherein adhering at least one microelectronic die back surface of said plurality of microelectronic dice to at least one corresponding recess bottom surface of said plurality of recesses comprises adhering at least one microelectronic die back surface of said plurality of microelectronic dice to at least one corresponding recess bottom surface of said plurality of recesses with a thermally conductive material selected from the group consisting of resin material filled with thermally conductive particulate material and epoxy material filled with thermally conductive particulate material.

12. A method of fabricating a microelectronic package, comprising:
  providing a heat spreader having a first surface, said heat spreader having a plurality of recesses defined therein by a plurality of sidewalls extending from said heat spreader first surface to recess bottom surfaces of said plurality of recesses;
  disposing at least one of a plurality of microelectronic dice within each of said plurality of recesses, each of said plurality of microelectronic dice having an active surface, a back surface, and at least one side;
  adhering at least one of said plurality of microelectronic die back surfaces of said plurality of microelectronic dice to at least one corresponding recess bottom surface of said plurality of recesses; and
  singulating said plurality of microelectronic dice by cutting through said heat spreader, wherein adhering at least one microelectronic die back surface of said plurality of microelectronic dice to at least one corresponding recess bottom surface of said plurality of recesses comprises adhering at least one microelectronic die back surface of said plurality of microelectronic dice to at least one corresponding recess bottom surface of said plurality of recesses with a thermally conductive material selected from the group consisting metal and metal alloys.

13. A method of fabricating a microelectronic package, comprising:
  providing a heat spreader having a first surface, said heat spreader having a plurality of recesses defined therein by a plurality of sidewalls extending from said heat spreader first surface to recess bottom surfaces of said plurality of recesses;
  disposing at least one of a plurality of microelectronic dice within each of said plurality of recesses, each of said plurality of microelectronic dice having an active surface, a back surface, and at least one side;
  adhering at least one of said plurality of microelectronic die back surfaces of said plurality of microelectronic dice to at least one corresponding recess bottom surface of said plurality of recesses; and
  singulating said plurality of microelectronic dice by cutting through said heat spreader, wherein adhering said at least one microelectronic die back surface of said plurality of microelectronic dice to at least one corresponding recess bottom surface of said plurality of recesses further includes:
    disposing a plurality of first solder bumps on at least one microelectronic die back surface of said plurality of microelectronic dice;
    disposing a plurality of second solder bumps on at least one corresponding recess bottom surface of said plurality of recesses; and
    forming a substantially continuous solder layer between said at least one microelectronic die back surface to said recess bottom surface by reflowing said plurality of first solder bumps and said second plurality of solder bumps.

14. The method of claim 13, wherein disposing a plurality of first solder bumps on said at least one microelectronic die back surface comprises:
  patterning a solder dam material on said at least one microelectronic die back surface;
  forming said plurality of solder bumps extending through said solder dam material; and
  removing said solder dam material.

15. The method of claim 13, wherein disposing a plurality of second solder bumps on said recess bottom surface comprises:
  patterning a solder dam material on said at least one microelectronic die back surface;
  forming said plurality of solder bumps extending through said solder dam material; and
  removing said solder dam material.

16. The method of claim 13, wherein forming a substantially continuous solder layer between said at least one microelectronic die back surface to said recess bottom surface comprises:
  reflowing said plurality of first solder bumps and said second plurality of solder bumps to align said at least one microelectronic die within said recess; and
  exerting pressure on said at least one microelectronic die back surface toward said heat spreader.

17. The method of claim 16, further including inducing at least a partial vacuum during said forming said substantially continuous solder layer.

* * * * *

UNITED STATES PATENT AND TRADEMARK OFFICE
CERTIFICATE OF CORRECTION

PATENT NO. : 6,709,898 B1
DATED : March 23, 2004
INVENTOR(S) : Ma et al.

It is certified that error appears in the above-identified patent and that said Letters Patent is hereby corrected as shown below:

Title page, Item [54] and Column 1, line 1,
Title, delete "DIE-IN-HEAT" and insert -- DIE-IN HEAT --, therefor.

Title page,
Item [56], References Cited, OTHER PUBLICATIONS, delete
"IBM Technical Disclosure Bulletin, p. 4469-4470, Mar. 1980." (second occurrence)

Signed and Sealed this

Third Day of August, 2004

JON W. DUDAS
*Acting Director of the United States Patent and Trademark Office*